US011665877B1

(12) United States Patent
Zhang et al.

(10) Patent No.: US 11,665,877 B1
(45) Date of Patent: May 30, 2023

(54) STACKED FET SRAM DESIGN

(71) Applicant: International Business Machines Corporation, Armonk, NY (US)

(72) Inventors: Chen Zhang, Guilderland, NY (US); Ruilong Xie, Niskayuna, NY (US); Junli Wang, Slingerlands, NY (US); Dechao Guo, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 24 days.

(21) Appl. No.: 17/564,902

(22) Filed: Dec. 29, 2021

(51) Int. Cl.
*H10B 10/00* (2023.01)
*G11C 11/412* (2006.01)
*G11C 11/417* (2006.01)
*G11C 11/41* (2006.01)

(52) U.S. Cl.
CPC .............. *H10B 10/12* (2023.02); *G11C 11/41* (2013.01); *G11C 11/412* (2013.01); *G11C 11/417* (2013.01)

(58) Field of Classification Search
CPC ........ H10B 10/00; H10B 10/12; G11C 11/41; G11C 11/412
See application file for complete search history.

(56) References Cited

U.S. PATENT DOCUMENTS

| 7,825,437 | B2 | 11/2010 | Pillarisetty et al. |
| 9,208,853 | B2 * | 12/2015 | Kolar .................... G11C 11/419 |
| 10,297,592 | B2 | 5/2019 | Morrow et al. |
| 10,535,667 | B1 * | 1/2020 | Liaw ...................... H10B 10/12 |
| 10,916,550 | B2 | 2/2021 | Liaw |
| 10,950,609 | B2 | 3/2021 | Yang |
| 10,964,706 | B2 | 3/2021 | Smith et al. |
| 10,971,503 | B2 | 4/2021 | Liaw |
| 11,087,832 | B1 | 8/2021 | Gomes et al. |
| 2008/0094870 | A1 | 4/2008 | Tsujimura et al. |
| 2020/0066732 | A1 | 2/2020 | Rubin |
| 2020/0211911 | A1 | 7/2020 | Sharma et al. |
| 2021/0074350 | A1 | 3/2021 | Vincent et al. |

FOREIGN PATENT DOCUMENTS

| CN | 111668219 A | 9/2020 |
| CN | 112602193 A | 4/2021 |

OTHER PUBLICATIONS

Schuddinck, R. J. et al., "The Complementary FET (CFET) for CMOS scaling beyond N3", 2018 Symposium on VLSI Technology Digest of Technical Papers, Jun. 2018, pp. 141-142.
International Search Report and Written Opinion dated Feb. 21, 2023, received in a corresponding foreign application, 7 pages.

\* cited by examiner

*Primary Examiner* — Kretelia Graham
(74) *Attorney, Agent, or Firm* — Scully, Scott, Murphy & Presser, P.C.; Samuel A. Waldbaum (57) ABSTRACT

A compact SRAM design in a stacked architecture is provided. Notably, a 6-transistor SRAM bite cell including a bottom device level containing bottom field effect transistors and a top device level, stacked above the bottom device level, containing top field effect transistors of a different conductivity type than the bottom field effect transistors is provided.

18 Claims, 7 Drawing Sheets

STACKED FET SRAM DESIGN

BACKGROUND

The present application relates to semiconductor technology, and more particularly to a semiconductor structure including a stacked field effect transistor (FET) with a static random access memory (SRAM) design.

Monolithic stacking of transistors is an attractive architecture for future complementary metal oxide semiconductor (CMOS) scaling, and potentially for ultimately scaled technology. By directly stacking one type of FET (e.g., an n-type FET) over another type (e.g., a p-type FET), significant area scaling can be achieved.

SRAM is a type of random access memory (RAM) that uses latch circuitry (flip-flop) to store each bit. A typical SRAM cell is made up of six FETs. Each bit in a conventional SRAM is stored on four of the transistors that form two cross-coupled inverters. This storage cell has two stable states which are used to denote 0 and 1. Two additional access transistors serve to control the access to a storage cell during read and write operations. In addition to such six-transistor (6T) SRAM, other kinds of SRAM chips use 4, 8, 10 (4T, 8T, 10T SRAM), or more transistors per bit. Providing a SRAM design in a stacked architecture is a challenge.

SUMMARY

The present application provides a compact SRAM design in a stacked architecture. Notably, the present application provides a 6-transistor SRAM bit cell including a bottom device level containing bottom field effect transistors and a top device level, stacked above the bottom device level, containing top field effect transistors of a different conductivity type than the bottom field effect transistors.

In one aspect of the present application, a semiconductor structure is provided that has a compact SRAM design and a stacked architecture. In one embodiment, the semiconductor structure includes a bottom device level including a first bottom field effect transistor (FET) of a first conductivity type, a second bottom FET of the first conductivity type, a third bottom FET of the first conductivity type, and a fourth bottom FET of the first conductivity type, wherein the first bottom FET is electrically connected to the second bottom FET and the third bottom FET is electrically connected to the fourth bottom FET, and the first bottom FET is located diagonally to the fourth bottom FET and the second bottom FET is located diagonally to the third bottom FET, and the first bottom FET and the fourth bottom FET are pass gates. The semiconductor structure further includes a top device level stacked above the bottom device level and including a first top FET of a second conductivity type different from the first conductivity type located directly above the first bottom FET, a second top FET of the second conductivity type located directly above the second bottom FET, a third top FET of the second conductivity type located directly above the third bottom FET, and a fourth top FET of the second conductivity type located directly above the fourth bottom electrode, wherein the first top FET is electrically connected to the second top FET and the third top FET is electrically connected to the fourth top FET, and the first top FET is a first dummy transistor which is wired to cross-couple with the third top FET and the fourth top FET is a second dummy transistor which is wired to cross-couple with the second top FET, and the second bottom FET and the second top FET are wired to provide a first inverter and the third bottom FET and the third top FET are wired to provide a second inverter.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Stacked FETs are considered as a device platform for logic CMOS beyond the 2 nm node. The present application provides a compact SRAM design for used in stacked FET technology. Notably, the present application provides a semiconductor structure including a 6-transistor SRAM bit cell that includes a bottom device level containing bottom field effect transistors and a top device level, stacked above the bottom device level, containing top field effect transistors of a different conductivity type than the bottom field effect transistors. The semiconductor structure of the present application includes two CMOS inverters, where the output potential of each inverter is fed as an input into the other CMOS inverter. The pass gate (or access transistors), the word line (WL), and the bit line (BL) are used to read and write from, or to, the cell. These and other aspects of the present application will now be described in greater detail.

Figure 1:
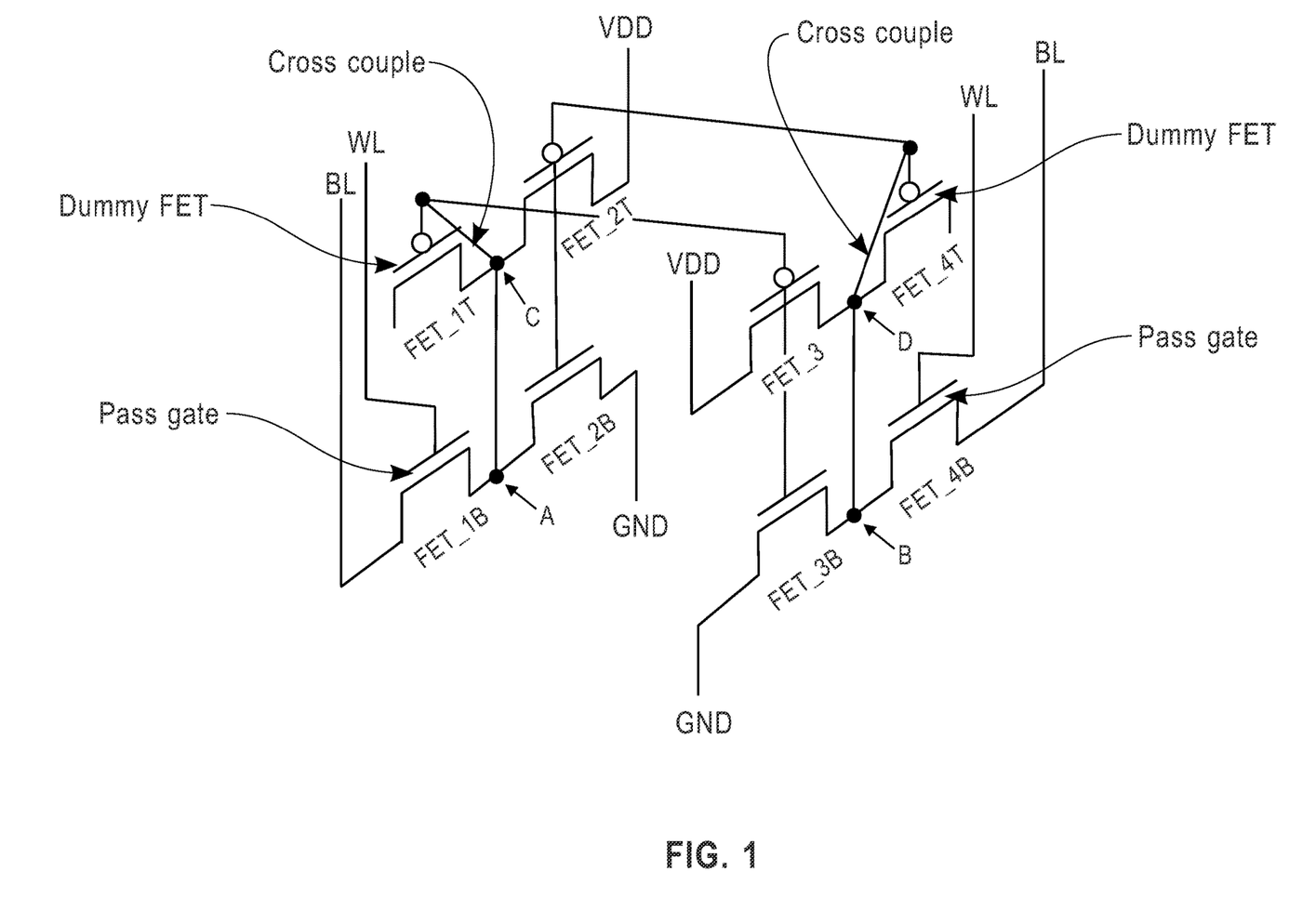
FIG. 1 is a circuit diagram of a semiconductor structure in accordance with an embodiment of the present application.

Reference is first made to FIG. 1 which is a circuit diagram of a semiconductor structure in accordance with an embodiment of the present application; the semiconductor structure having such a circuit diagram is shown in the remaining drawings of the present application. Notably, and as is exemplified by the circuit diagram shown in FIG. 1, the semiconductor structure of the present application includes a bottom device level including a first bottom field effect transistor (FET) of a first conductivity type (herein after "FET_1B"), a second bottom FET of the first conductivity type (herein after "FET_2B"), a third bottom FET of the first conductivity type (herein after "FET_3B"), and a fourth bottom FET of the first conductivity type (herein after "FET_4B"). The term "FET" denotes a type of transistor that uses an electric field to control the flow of current in a semiconductor material. FETs are devices with three terminals, a source region, a gate, and a drain region, FETs control the flow of current by the application of a voltage to the gate, which in turn alters the conductivity between the source region and the drain region.

In the semiconductor structure of the present application and as is illustrated in FIG. 1. FET_1B is electrically connected to FET_2B at node A; node A represents a shared source/drain region between FET_1B and FET_2B. In the semiconductor structure of the present application and as further illustrated in FIG. 1, FET_3B is electrically connected to FET_4B at node B; node B represents a shared source/drain region between FET_3B and FET_4B. In the semiconductor structure of the present application, FET_1B is located diagonally to FET_4B yet across from FET_3B, and FET_2B is located diagonally to FET_3B yet across from FET_4B.

In accordance with embodiments of the present application, FET_1B and FET_4B serve as pass gates (i.e., access transistors). As is shown in FIG. 1, each of FET_1B and FET_4B is configured, i.e., wired, to be connected to a bit line (BL); notably one BL connection is located on a side of FET_1B that is opposite the shared source/drain region (i.e., node A), while another BL connection is located on a side of FET_4B that is opposite the shared source/drain region (i.e., node B). Also, and as is shown in FIG. 1, each of FET_2B and FET_3B is configured, i.e., wired, to be connected to ground (GND); notably one GND connection is located on side of FET_2B that is opposite the shared source/drain region (i.e., node A), while another GND connection is located on a side of FET_3B that is opposite the shared source/drain region (i.e., node B). FIG. 1 also shows that each of FET_1B and FET_4B is configured, i.e., wired, to be connected to a word line (WL); notably, one WL connection contacts a gate of FET_1B, while another WL connection contacts a gate of FET_4B.

The semiconductor structure as exemplified in FIG. 1 further includes a top device level stacked above the bottom device level. The top device level includes a first top FET of a second conductivity type (herein after "FET_1T") located directly above FET_1B, a second top FET of the second conductivity type (herein after "FET_2T") located directly above FET_2B, a third top FET of the second conductivity type (herein after "FET_3T") located directly above FET_3B, and a fourth top FET of the second conductivity type (herein after "FET_4T") located directly above FET_4B. Notably, the various FETs of the top device level are stacked above the various FETs of the bottom device level. In the present application, the second conductivity type is different, i.e., opposite conductivity, from the first conductivity type. In some embodiments, the first conductivity type can be n-type, while the second conductivity type can be p-type. In other embodiments, the first conductivity type can be p-type, while the second conductivity type can be n-type. In such an embodiment, the location of VDD and GND would be swapped.

In accordance with the present application, FET_1T is electrically connected to FET_2T at node C; node C represents a shared source/drain region between FET_1T and FET_2T. In the semiconductor structure of the present application and as further illustrated in FIG. 1, FET_3T is electrically connected to FET_4T at node D; node D represents a shared source/drain region between FET_3T and FET_4T. In the semiconductor structure of the present application, FET_1T is located diagonally to FET_4T yet across from FET_3T, and FET_2T is located diagonally to FET_3T yet across from FET_4T. As is shown in FIG. 1, node A is wired to be connected to node C, and node B is wired to be connected to node D.

In embodiments of the present application, each of FET_2T and FET_3T is configured, i.e., wired, to be connected to a power supply (VDD); notably one VDD connection is located on a side of FET_2T that is opposite the shared source/drain region (i.e., node C), while another VDD connection is located on a side of FET_3T that is opposite the shared source/drain region (i.e., node D).

In accordance with the present application, FET_2B and FET_2T are wired to provide a first inverter and FET_3B and FET_3T are wired to provide a second inverter. As known in a SRAM structure, two inverters are cross coupled in the sense that the output node of one inverter is connected to the input of the second and vice versa. As shown in FIG. 1, the input of the first inverter is connected to the gate of FET_4T; FET_4T serves as one a dummy transistor. On the wafer, this is achieved by a shared gate line. The output of the second inverter (node D) is a source/drain region of the dummy transistor FET_4T. By connecting the gate of the FET_4T to node D, the first piece of cross couple is formed. The input of the second inverter is connected to the gate of FET_1T; FET_1 serves as another dummy transistor. On the wafer, this is achieved by a shared gate line. The output of the first inverter (node C) is a source/drain region of the dummy transistor FET_1T. By connecting the gate of the FET_1T to node C, the second piece of cross couple is formed to complete the cross couple. Notably, the cross-couple of the first dummy transistor (i.e., FET_1T) with the FET-3T comprises a first contact metal that contacts both a gate electrode and a source/drain region of the first dummy gate region, and the cross-couple of the second dummy transistor (i.e., FET_4T) with the FET_2T comprises a second contact metal that contacts both a gate electrode and a source/drain region of the second dummy gate region.

In embodiment, the first top FET, the third top FET and the third bottom FET electrically share a common gate electrode, and the fourth top FET, the second top FET and the second bottom FET electrically share a common gate electrode.

It is known that in addition to cross coupled inverter pair, a 6T SRAM needs two pass-gate transistors for read and write functions. The gate of each pass-gate transistors is called a word line (WL). FET_1B with one of its source/drain regions connected to the first inverter output (node A) serves as one of the pass-gate transistors. The other source/drain region serves as the bit line (BL). FET_4B with one of its source/drain regions connected to the second inverter output (node B) serves as the other pass-gate transistor. The other source/drain region serves as the bit line (BL).

Figure 2A:
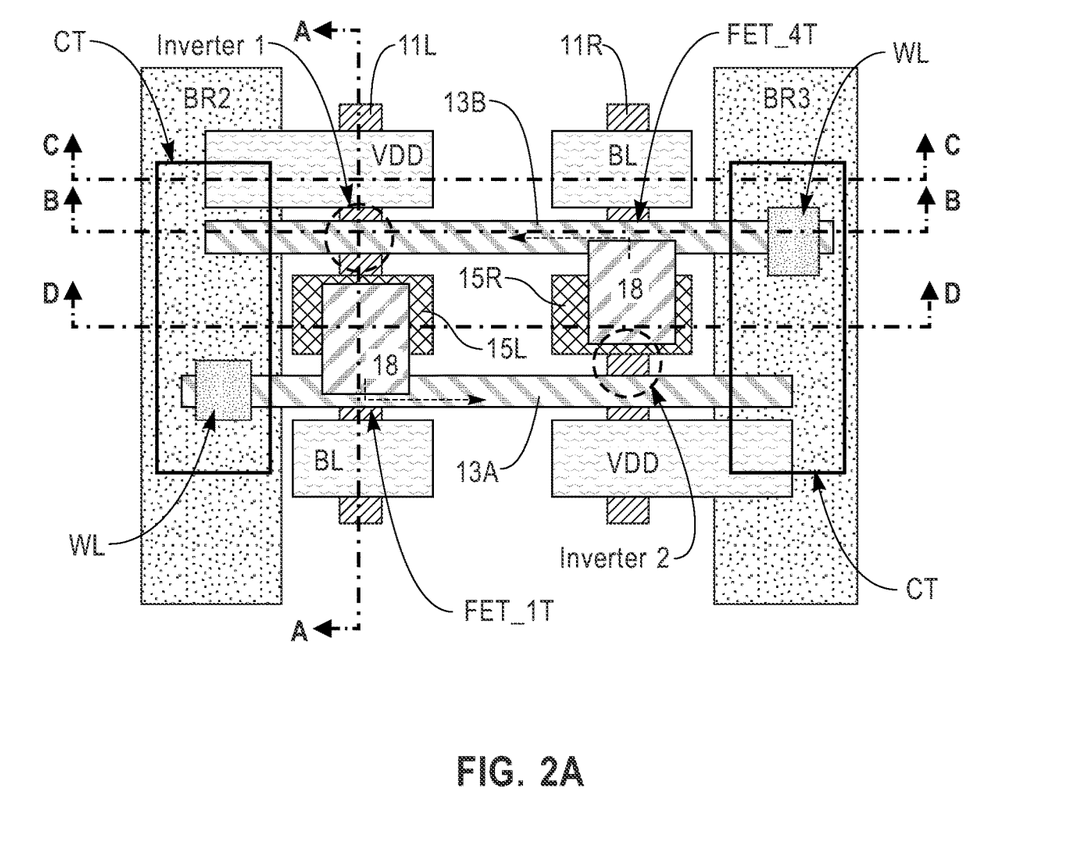
FIG. 2A is a top-down view illustrating the design lay-out of the top device level of the semiconductor structure in accordance with an embodiment of the present application.
Figure 2B:
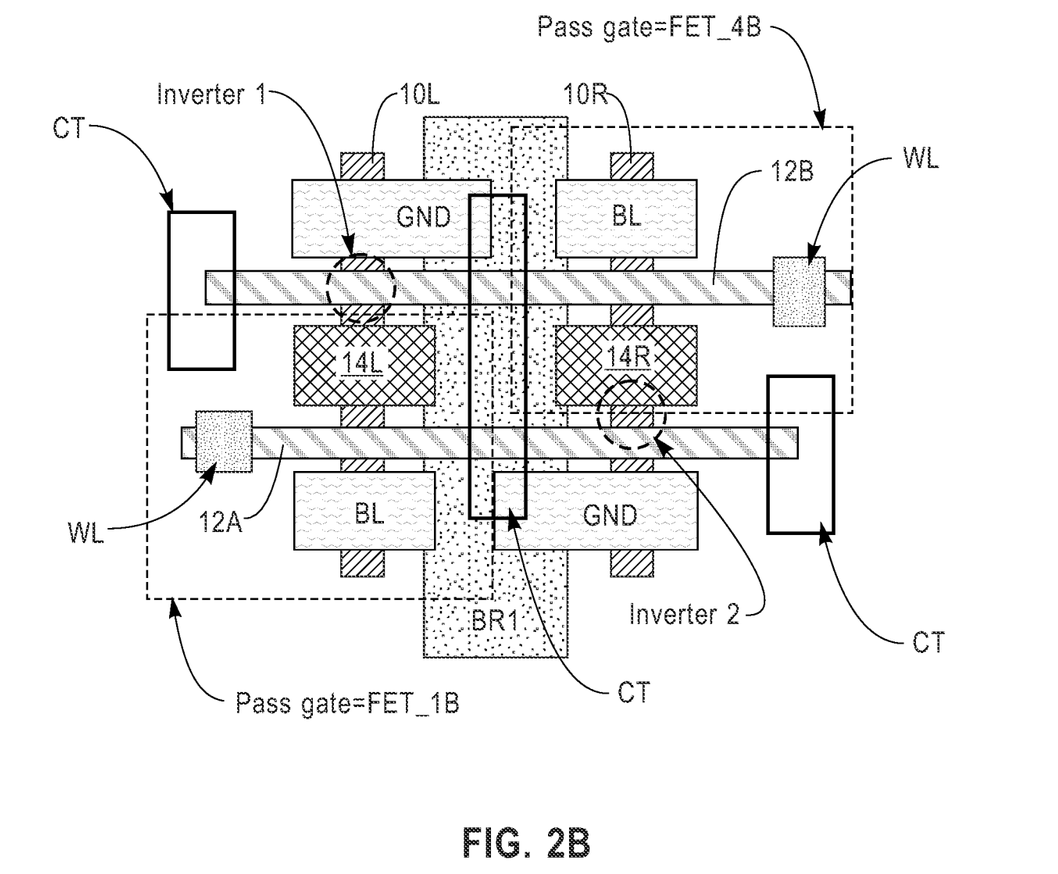
FIG. 2B is a top-down view illustrating the design lay-out of the bottom device level of the semiconductor structure in accordance with an embodiment of the present application; this bottom device level is located beneath the top device level illustrated in FIG. 1A.

Reference is now made to FIGS. 2A and 2B which are top down views illustrating the design lay-out of each of various device levels of the semiconductor structure of the present application. Notably, FIG. 2A is a top-down view illustrating the design lay-out of the top device level, while FIG. 2B is a top-down view illustrating the design lay-out of the bottom device level. In accordance with the present application, the top down view illustrated in FIG. 2A would be stacked above the bottom device level shown in FIG. 2B.

Reference is first made to the bottom device level shown in FIG. 2B, there is illustrated two bottom semiconductor channel material structures 10L and 10R that are spaced apart and oriented parallel to each other. In embodiments, the bottom semiconductor channel material structures 10L and 10R can be semiconductor fins as shown in FIG. 2B. Other types of bottom semiconductor channel material structures 10L and 10R including, for example semiconductor nanosheets or semiconductor nanowires can also be used instead of the semiconductor fins illustrated in FIG. 2B. The bottom semiconductor channel material structures 10L and 10R are composed of a semiconductor material that has semiconductor properties. Illustrative examples of semiconductor materials that can be used in the present application include, silicon (Si), a silicon germanium (SiGe) alloy, a silicon germanium carbide (SiGeC) alloy, germanium (Ge), a III/V compound semiconductor, an II/VI compound semiconductor or a multilayered stack including at least two semiconductor materials (e.g., a multilayered stack of Si and SiGe).

FIG. 2B also shows the presence of two bottom gate structures 12A and 12B that are spaced apart and oriented parallel to each other. The two bottom gate structures 12A and 12B are orientated perpendicular to the two bottom semiconductor channel material structures 10L and 10R. Each bottom gate structure straddles over a portion of the two bottom semiconductor channel material structures 10L and 10R as illustrated in FIG. 2B. Each bottom gate structure 12A and 12B includes a gate dielectric material and a gate electrode to be described in greater detail herein below. In FIG. 2B, two pass gate regions are shown. One of the pass gate regions includes FET_1B shown in FIG. 1, while the other pass gate region includes FET_4B shown in FIG. 1. The other regions of the design lay-out shown in FIG. 2B includes a region that includes a bottom portion of the first inverter, i.e., inverter 1, and another region that includes a bottom portion of the second inverter, i.e., inverter 2.

In FIG. 2B, there are also shown shared source/drain regions 14L and 14R. Shared source/drain region 14L is equivalent to node A shown in FIG. 1, while shared source/drain region 14R is equivalent to node B shown in FIG. 1. Also, shown in FIG. 2B are WL contacts, BL contacts, and GND contacts which are configured as described above in regard to FIG. 1. The bottom device level also includes gate cut, CT, regions, and a bottom buried power rail BR1. Each gate cut region denotes an area in which a gate structure is cut, and the buried power rail BR1 is connected to GND contacts. The buried power rails sit below the stacked structure and they are optional.

Reference is now made to FIG. 2A, which illustrates the top down view of the design lay-out of the present application. FIG. 2A would be located atop the top down view illustrated in FIG. 2B such that FET_1T is stacked directly above FET_1B, FET_4T is stacked directly above FET_4B, inverter 1 region shown in the top device level is stacked directly above inverter 1 region shown in the bottom device level, and inverter 2 region shown in the top device level is stacked directly above inverter 2 region shown in the bottom device level.

The top device level includes two top semiconductor channel material structures 11L and 11R that are spaced apart and oriented parallel to each other. In embodiments, the top semiconductor channel material structures 11L and 11R can be semiconductor fins as shown in FIG. 2A, typically but not necessarily always the top semiconductor channel material structures match the bottom semiconductor channel material structures; i.e., they are of the same geometry. Other types of top semiconductor channel material structures 11L and 11R including, for example semiconductor nanosheets or semiconductor nanowires can also be used instead of the semiconductor fins illustrated in FIG. 2A. The top semiconductor channel material structures 11L and 11R are composed of one of the semiconductor materials mentioned above. In embodiments, the semiconductor material that provides the top semiconductor channel material structures 11L and 11R can be compositionally the same as, or compositionally different from, the semiconductor material that provides the bottom semiconductor channel material structures 10L and 10R.

FIG. 2A also shows the presence of two top gate structures 13A and 13B that are spaced apart and oriented parallel to each other. The two top gate structures 13A and 13B are orientated perpendicular to the two top semiconductor channel material structures 11L and 11R. Each top gate structure straddles over a portion of the two top semiconductor channel material structures 11L and 11R as illustrated in FIG. 2A. Each top gate structure 13A and 13B includes a gate dielectric material and a gate electrode to be described in greater detail herein below. In FIG. 2A, FET_1T and FET_4T are dummy transistors which are wired as described in FIG. 1 to provide cross-coupling with FET_3T and FET_2T, respectively. The design lay-out shown in FIG. 2A includes a region that includes a top portion of the first inverter, i.e., inverter 1, and another region that includes a top portion of the second inverter, i.e., inverter 2.

In FIG. 2A, there are also shown shared source/drain regions 15L and 15R. Shared source/drain region (shared between top FET and bottom FET) 15L is equivalent to node C shown in FIG. 1, while shared source/drain region 15R is equivalent to node D shown in FIG. 1. On the wafer, the shared top-bottom source/drain region can be realized by forming a contact that connects to both a top source/drain region and the bottom source/drain region directly beneath it. Also, shown in FIG. 2A are cross coupling contacts 18, WL contacts, BL contacts, and VDD contacts which are configured as described above in regard to FIG. 1. The top device level also includes gate cut, CT, regions, and a first buried power rail BR2 and a second buried power rail BR3. Each gate cut region denotes an area in which a gate structure is cut, and the buried power rails BR2 and BR3 are connected to VDD. The buried power rails sit below the stacked structure and they are optional.

In accordance with the present application, the output (i.e., shared source/drain region 15L) of the top portion of inverter 1 is connected to the input (i.e., gate electrode, 13A) of top portion of inverter 2. Also, and in accordance with the present application the output (i.e., shared source/drain region 15R) of the top portion of inverter 2 is connected to the input (i.e., gate electrode, 13B) of top portion of inverter 1. The structures labeled as 18 in FIG. 2A provide such connections.

It is noted that the top-down view of the top device level includes cut A-A, cut B-B, cut C-C and cut D-D. Cut A-A passes through top semiconductor channel material structure 11L and bottom semiconductor channel material structure 10L, cut B-B passes through the top gate structure 13B and the bottom gate structure 12B, cut C-C passes through one side of the top gate structure 13B and bottom gate structure 12B not including a shared source/drain region, and cut D-D passes through another side of the top gate structure 13B and bottom gate structure 12B that includes the shared source/drain regions 15L, 15R and 14L, 14R. These various cuts will be used to further exemplary certain aspects of the semiconductor structure of the present application.

Figure 3A:
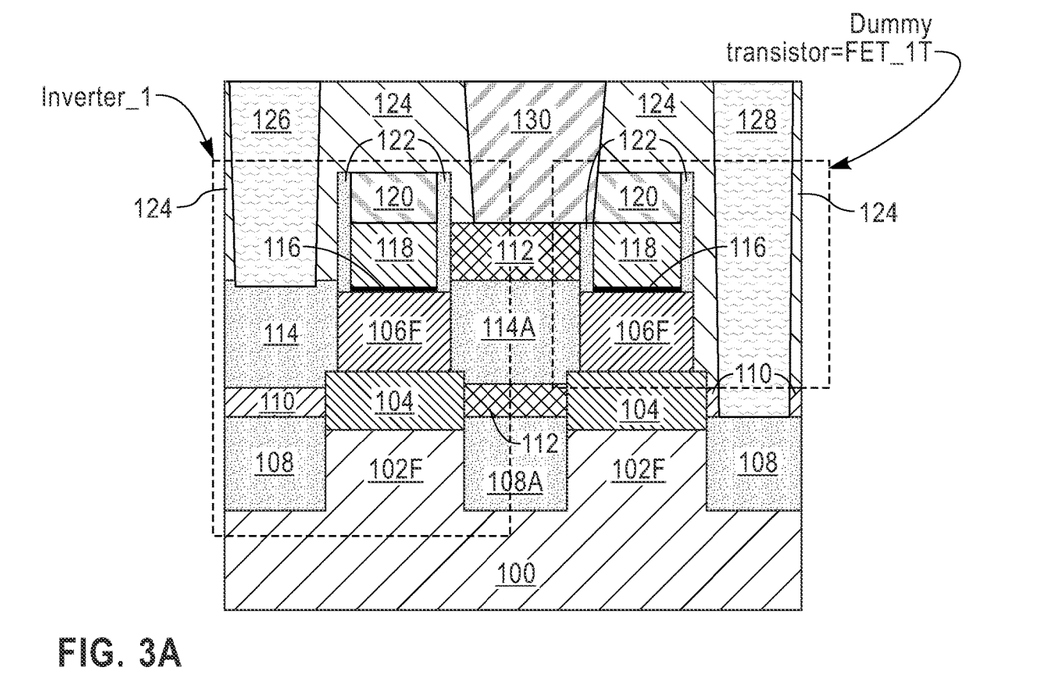
FIG. 3A is a cross sectional view through cut A-A shown in FIG. 2A in accordance with an embodiment of the present application.
Figure 3B:
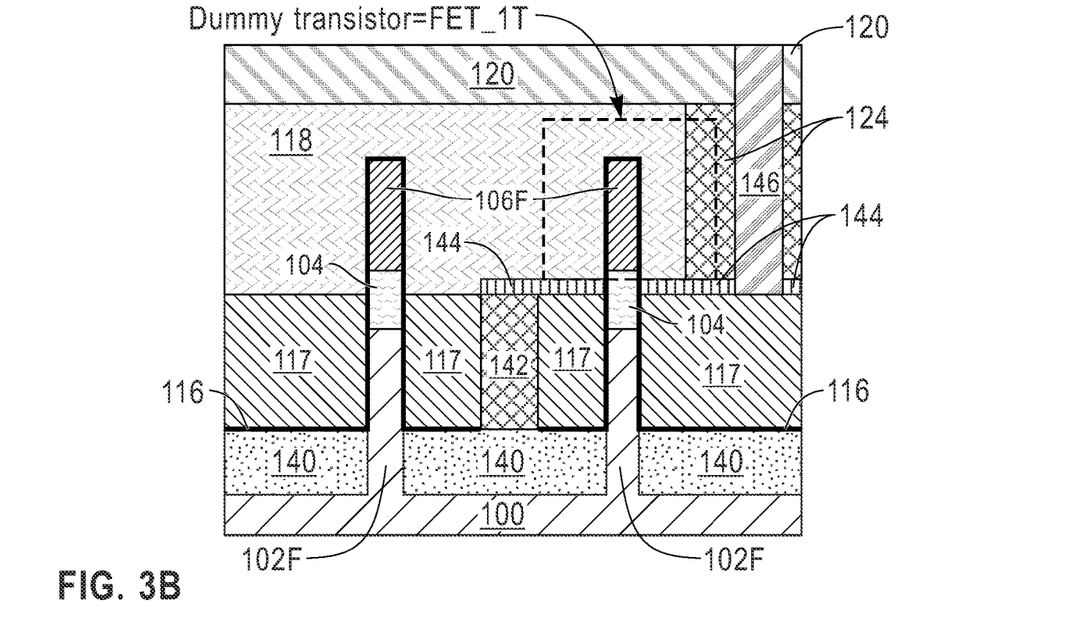
FIG. 3B is a cross sectional view through cut B-B shown in FIG. 2A in accordance with an embodiment of the present application.
Figure 3C:
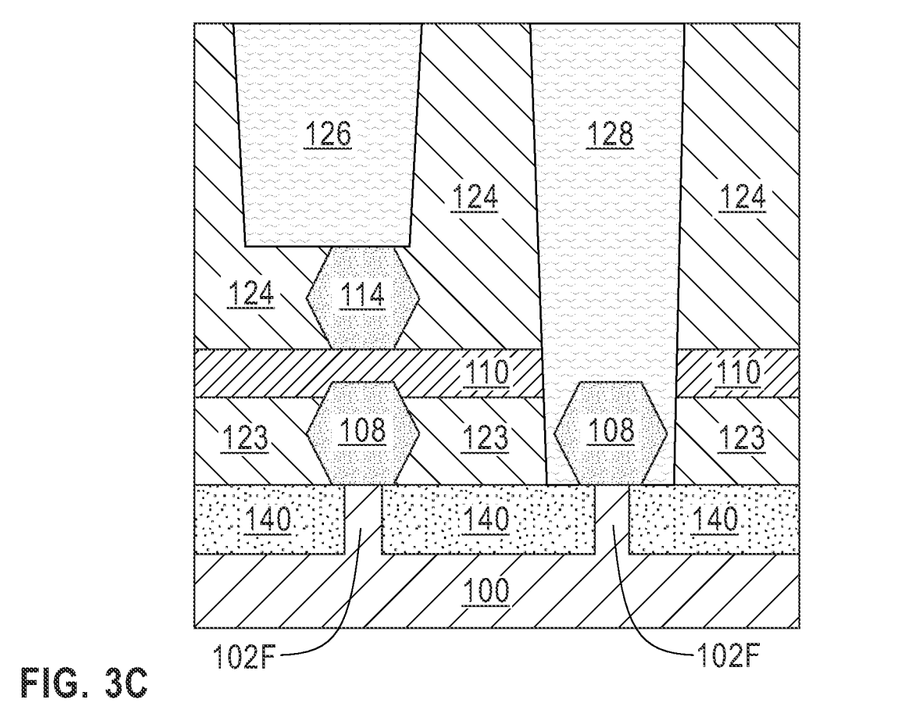
FIG. 3C is a cross sectional view through cut C-C shown in FIG. 2A in accordance with an embodiment of the present application.
Figure 3D:
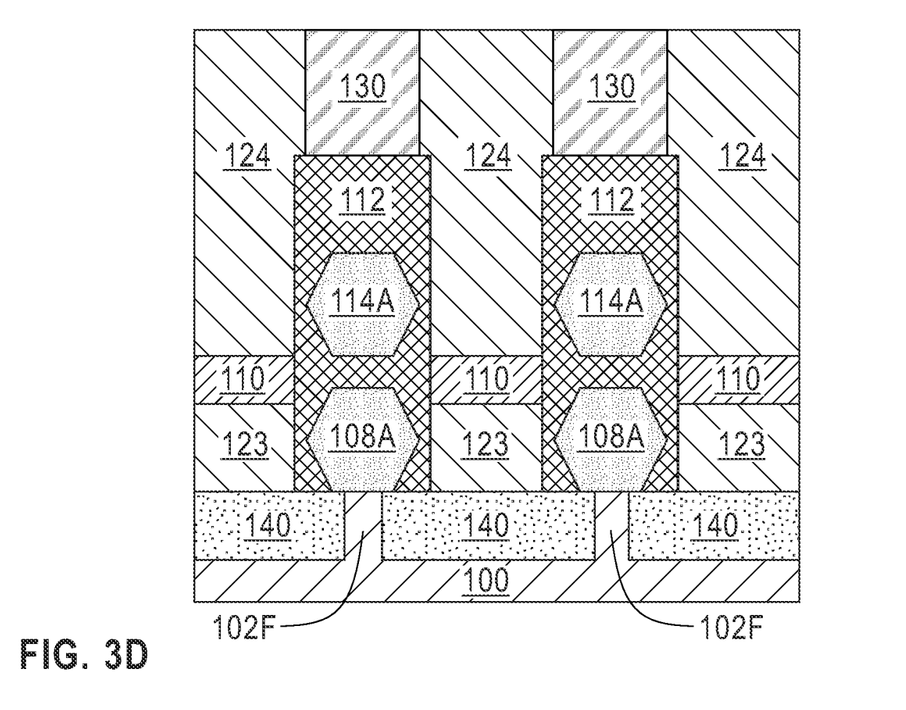
FIG. 3D is a cross sectional view through cut D-D shown in FIG. 2A in accordance with an embodiment of the present application.

Reference is now made to FIGS. 3A, 3B, 3C and 3D, which illustrate the semiconductor structure of the present application through various cross-sectional views. Notably, FIG. 3A is a cross sectional view of the semiconductor structure through cut A-A shown in FIG. 2A, FIG. 3B is a cross sectional view of the semiconductor structure through cut B-B shown in FIG. 2A, FIG. 3C is a cross sectional view of the semiconductor structure through cut C-C shown in FIG. 2A, and FIG. 3D is a cross sectional view of the semiconductor structure through cut D-D shown in FIG. 2A in accordance with an embodiment of the present application. In this embodiment, the semiconductor channel material structures in the top and bottom device levels are semiconductor fins.

Notably, and referring first to FIG. 3A, there is illustrated a pair of bottom semiconductor fins 102F extending upwards from a surface of a semiconductor substrate 100. The bottom semiconductor fins 102F and the semiconductor substrate 100 are composed of one of the semiconductor materials mentioned above for the bottom semiconductor channel material structures. In some embodiments, the semiconductor material that provides the bottom semiconductor fins 102F is compositionally the same as the semiconductor material that provides the semiconductor substrate 100. In such embodiments and as shown in FIG. 3A, no material interface exists between the semiconductor substrate 100 and the bottom semiconductor fins 102F. In other embodiments, the semiconductor material that provides the bottom semiconductor fins 102F is compositionally different from the semiconductor material that provides the semiconductor substrate 100. In such embodiments (not illustrated), a material interface would exist between the semiconductor substrate 100 and the bottom semiconductor fins 102F.

The semiconductor structure shown in FIG. 3A also includes a pair of top semiconductor fins 106F stacked above, but spaced apart from the bottom semiconductor fins 102F. The top semiconductor fins 106F include one of the semiconductor materials mentioned above for the bottom semiconductor channel material structures. The semiconductor material that provides the top semiconductor fins 106F can be compositionally the same as, or compositionally different from, the semiconductor material that provides the bottom semiconductor fins 102F. In embodiments, the semiconductor material that provides each bottom semiconductor fin 102F is a semiconductor material that is capable of providing high channel mobility for nFET devices, while the semiconductor material that provides each top semiconductor fin 106F is a semiconductor material that is capable of providing high channel mobility for pFET devices. In other embodiments, the opposite compositionally configuration can be used.

In the present application, and as is shown in FIG. 3A, the top semiconductor fins 106F are spaced apart from the bottom semiconductor fins 102F by a stacked device channel isolation structure 104. The stacked device channel isolation structure 104 includes a dielectric material such as, for example, silicon dioxide, silicon nitride, silicon oxynitride or any combination thereof. In the present application, stacked device channel isolation structures isolates FET_1B from FET_1T, FET_2B from FET_2T, FET_3B from FET_3T, and FET_4B from FET_4T.

In accordance with the present application, bottom source/drain regions 108, 108A are located laterally adjacent to the bottom semiconductor fins 102F. Bottom source/drain regions 108 are non-shared source/drain regions, while bottom source/drain region 108A is a shared source/drain region. The bottom source/drain regions 108, 108A have an epitaxial relationship with (same crystal orientation as) the sidewalls of the bottom semiconductor fins 102F. As used herein, a "source/drain" region can be a source region or a drain region depending on subsequent wiring and application of voltages during operation of the FET. The bottom source/drain regions 108, 108A include a semiconductor material and a dopant. The semiconductor material that provides each bottom source/drain regions 108, 108A can include one of the semiconductor materials mentioned above. The semiconductor material that provides the bottom source/drain regions 108, 108A can be compositionally the same, or compositionally different from each bottom semiconductor fin 102F. The dopant that is present in each bottom source/drain regions 108, 108A can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, each source/drain region 30 can have a dopant concentration of from $4 \times 10^{20}$ atoms/cm$^3$ to $3 \times 10^{21}$ atoms/cm$^3$. In one example, each bottom source/drain region 46 is composed of phosphorus doped silicon.

In accordance with the present application, top source/drain regions 114, 114A are located laterally adjacent to the top semiconductor fins 106F. Top source/drain regions 114 are non-shared source/drain regions, while top source/drain region 114A is a shared source/drain region. The top source/drain regions 114, 114A have an epitaxial relationship with (same crystal orientation as) the sidewalls of the top semiconductor fins 106F. The semiconductor material that provides each top source/drain regions 114, 114A can include one of the semiconductor materials mentioned above. The semiconductor material that provides the top source/drain regions 114, 114A can be compositionally the same as, or compositionally different from, each top semiconductor fin 106F and/or the bottom source/drain regions 108, 108A. The dopant that is present in each top source/drain regions 114, 114A can be either a p-type dopant or an n-type dopant. The top source/drain regions 114, 114A are of a different conductivity type than the bottom source/drain regions 108, 108A. Note that a top source/drain region 114 is absent from a sidewall of the top semiconductor fin 106F in the area labeled as dummy transistor; the dummy transistor is thus a non-functional device. In embodiments (not shown), the top source/drain region can be partially removed from a sidewall of the top semiconductor fin 106F in the area labeled as dummy transistor.

The top source/drain regions 114 are spaced apart from each other by a source/drain isolation structure 110, The source/drain isolation structure 110 is composed of one of the dielectric materials mentioned above for the stacked device channel isolation structure 104. The dielectric material that provides the source/drain isolation structure 110 is typically compositionally different from the stacked device channel isolation structure 104.

Top source/drain region 114A and bottom source/drain region 108A are connected together by S/D connector 112. S/D connector 112 is a metal contact that touches both the top source/drain region 114A and the bottom source/drain region 108A. In this embodiment, top source/drain region 114A and bottom source/drain region 108A are connected together as an output of inverter 1.

The exemplary structure shown in FIG. 3A also includes a top gate structure that includes a gate dielectric material 116, a top gate electrode 118, and an optional top gate cap 120 located on a topmost surface of the top semiconductor fins 106F. The top gate structure would also be present along the sidewalls of the top semiconductor fins 106F. A bottom gate structure, not shown in this cross sectional view, but shown in FIG. 3B, would be present along sidewalls of the bottom semiconductor fins 102F. The bottom gate structure would include gate dielectric material 116, and a bottom gate electrode 117. Dielectric spacers 122 are present along at the sidewalls of the top gate structure shown in FIG. 3A.

In embodiments, the gate dielectric material 116 can include silicon dioxide, or a dielectric material having a dielectric constant greater than silicon dioxide (such dielectric materials can be referred to as a high-k gate dielectric material). Illustrative examples of high-k gate dielectric materials include metal oxides such as, for example, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide ($Pb(Sc,Ta)O_3$), and/or lead zinc niobite (Pb(Zn,Nb)O). The high-k gate dielectric material can further include dopants such as lanthanum (La), aluminum (Al) and/or magnesium (Mg).

In some embodiments, each of the top gate electrode 118 and the bottom gate electrode 117 is composed of an electrically conductive metal-containing material including, but not limited to tungsten (W), titanium (Ti), tantalum (Ta), ruthenium (Ru), zirconium (Zr), cobalt (Co), copper (Cu), aluminum (Al), lead (Pb), platinum (Pt), tin (Sn), silver (Ag), or gold (Au), tantalum nitride (TaN), titanium nitride (TiN), tantalum carbide ($TaC_x$), titanium carbide (TiC), titanium aluminum carbide, tungsten silicide ($WSi_2$), tungsten nitride (WN), ruthenium oxide ($RuO_2$), cobalt silicide, or nickel silicide. The electrically conductive metal-containing material that provides the top gate electrode 118 is typically compositionally different from the electrically conductive metal-containing material that provides the bottom gate electrode 117.

In some embodiments, a layer of workfunction metal (WFM) can be used solely as, or in combination with one of the electrically conductive metal-containing materials mentioned above to provide the top gate electrode 118 and the bottom gate electrode 117. The layer of WFM can be used to set a threshold voltage of the FET to a desired value. In some embodiments, the layer of WFM can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, the layer of WFM can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof.

The optional top gate cap 120 can be composed of any dielectric material such as, for example, silicon dioxide, silicon nitride and/or silicon nitride. The dielectric spacer 122 are composed of a spacer dielectric material such as, for example, silicon dioxide, silicon nitride and/or silicon nitride. The spacer dielectric material is typically compositionally different from the dielectric material that provides the top gate cap 120.

The exemplary structure shown in FIG. 3A also includes a top interlayer dielectric material (ILD) material layer 124 located laterally adjacent to the top gate structures, a bottom ILD material layer 123 can also be present as shown in FIG. 3C and FIG. 3D of the present application. The bottom ILD material layer 123 and the top ILD material layer 124 can be composed of a compositionally same, or compositionally different, ILD material. Illustrative ILD materials that can be employed include, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide.

Also shown in FIG. 3A is VDD contact 126, BL contact 128 and a cross coupling contact 130. VDD contact 126, BL contact 128 and cross coupling contact 130 can be composed of a same of different conductive contact material. In some embodiments, a contact liner (not shown) can be present around the VDD contact 126, the BL contact 128 and/or the cross coupling contact 130. The contact liner (not shown) can include a silicide liner, such as Ti, Ni, NiPt, etc., and a diffusion barrier material. Exemplary diffusion barrier materials include, but are not limited to, Ru, TiN, TaN, WN, WC, an alloy thereof, or a stack thereof such as Ti/TiN and Ti/WC. Illustrative examples of conductive contact materials that can be used in the present application include, for example, W, Cu, Al, Co, Ru, Mo, Os, Jr, Rh or an alloy thereof.

As is shown in FIG. 3A, VDD contact 126 is designed to contact one of the unshared top source/drain regions 114, the BL contact 128 is designed to contact the bottom source/drain region 108 in an area in which a dummy transistor is formed, and cross coupling contact 130 contacts the S/D connector 112 that is located above the top source/drain regions 114A. The cross coupling contact 130 also contacts the top gate structure of the dummy transistor as shown in FIG. 3A.

Reference is now made to FIG. 3B which is a cross sectional view of the exemplary structure along cut B-B mentioned above. In addition to including the elements/components mentioned above, the exemplary structure shown in FIG. 3B includes shallow trench isolation region 140, a dielectric structure 142 that is present in a gate cut region, dielectric cap 144. The shallow trench isolation region 140, the dielectric structure 142 and the dielectric cap 144 are composed of compositionally different dielectric material including one of silicon dioxide, silicon nitride and silicon oxynitride. FIG. 3B also shows the presence of a WL contact 146 which contacts a surface of the bottom gate electrode 117. The WL contact 146 includes an optional contact liner, as described above, and one of the conductive contact materials described above. Also, shown in FIG. 3B is that the top gate electrode 118 forms an extension of an input of one of the inverters from where the inverter sits to the place of the dummy transistor. This facilitates the formation of cross couple as a simple contact 130 now connects the input of one inverter to the output of the other one. Although not shown, the top gate electrode of FET_4T would form an extension of the input of the second inverter.

Reference is now made to FIG. 3C which is a cross sectional view of the exemplary structure along cut C-C mentioned above. This drawing shows the VDD contact 126 and BL contact 128 mentioned previously above.

Reference is now made to FIG. 3D which is a cross sectional view of the exemplary structure along cut D-D mentioned above. This drawing shows cross coupling contacts 130, as mentioned above, that are connected to the top and bottom shared source/drain regions 114A, 108A by S/D connector 112. The S/D connector 112 includes an optional contact liner, as described above, and one of the conductive contact materials described above.

The semiconductor structure shown in FIGS. 3A-3D can be fabricated utilizing any stacked FET processing flow in which semiconductor fins are used in both device levels. Such stacked FET processing includes various deposition steps, various patterning steps, various material removal steps and various planarization steps. So as not to obscure the semiconductor structure of the present application, these various processing steps are not further elaborated herein.

Figure 4A:
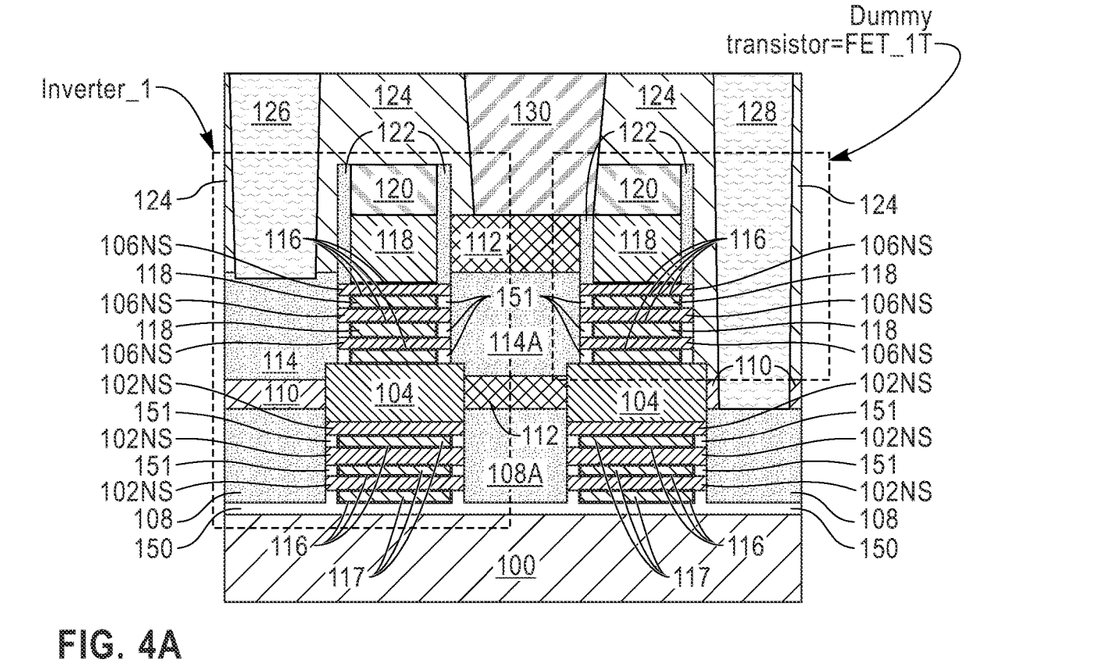
FIG. 4A is a cross sectional view through cut A-A shown in FIG. 2A in accordance with another embodiment of the present application.
Figure 4B:
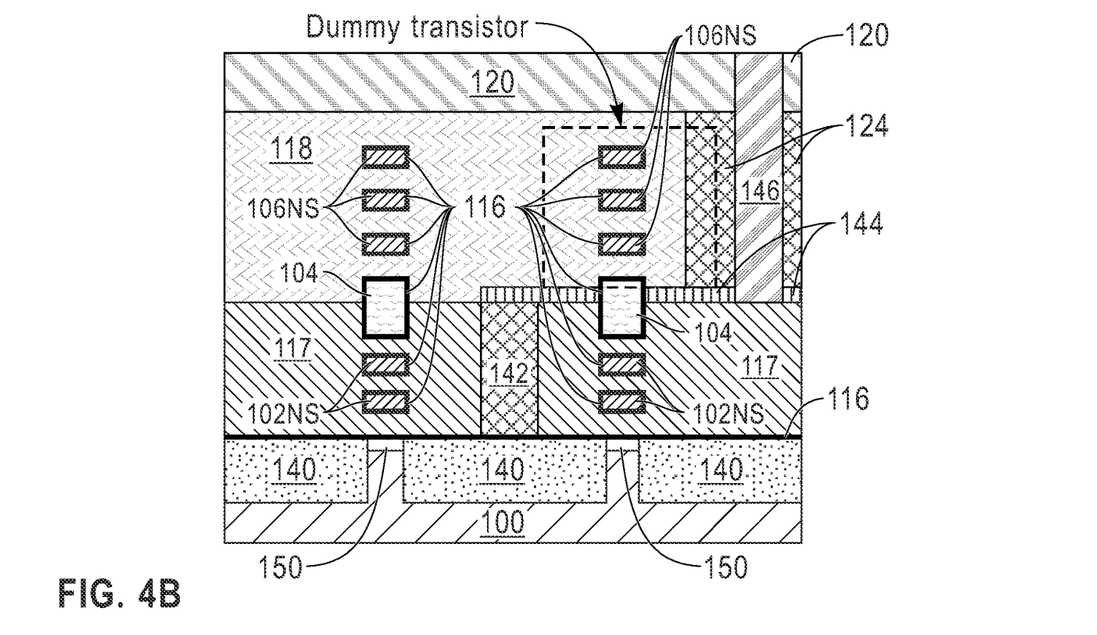
FIG. 4B is a cross sectional view through cut B-B shown in FIG. 2A in accordance with another embodiment of the present application.
Figure 4C:
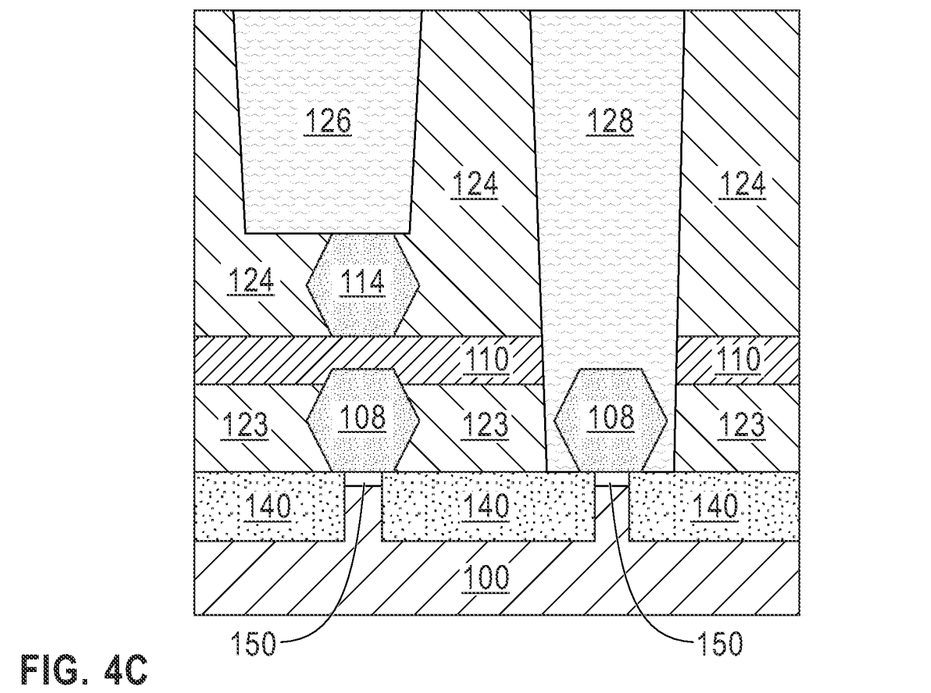
FIG. 4C is a cross sectional view through cut C-C shown in FIG. 2A in accordance with another embodiment of the present application.
Figure 4D:
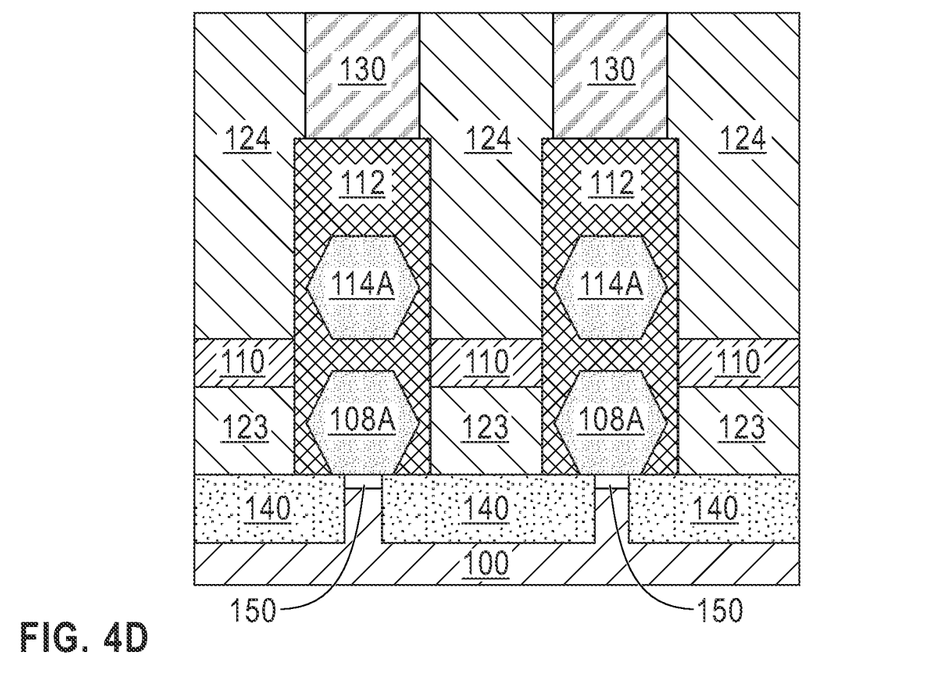
FIG. 4D is a cross sectional view through cut D-D shown in FIG. 2A in accordance with another embodiment of the present application.

Reference is now made to FIGS. 4A, 4B, 4C and 4D, which illustrate another semiconductor structure of the present application through various cross-sectional views. Notably, FIG. 4A is a cross sectional view of the semiconductor structure through cut A-A shown in FIG. 2A, FIG. 4B is a cross sectional view of the semiconductor structure through cut B-B shown in FIG. 2A, FIG. 4C is a cross sectional view of the semiconductor structure through cut C-C shown in FIG. 2A, and FIG. 4D is a cross sectional view of the semiconductor structure through cut D-D shown in FIG. 2A in accordance with an embodiment of the present application. The semiconductor structure shown in FIGS. 4A-4D is similar to the semiconductor structure shown in FIGS. 3A-3D except that the bottom semiconductor fin 102F and the top semiconductor fin 106F are replaced with at least one bottom semiconductor nanosheet 102NS and at one top semiconductor nanosheet 106NS, respectively. In FIGS. 4A-4D, a plurality of vertical stacked bottom semiconductor nanosheets 102NS and a plurality of vertically stacked top semiconductor nanosheets 106NS are illustrated. Other differences which the semiconductor structure shown in FIG. 4A-4D is that it contains a bottom dielectric isolation layer 150 located beneath the plurality of vertical stacked bottom semiconductor nanosheets 102NS and that inner spacers 151 are present between the various nanosheets in both the plurality of vertical stacked bottom semiconductor nanosheets 102NS and the plurality of vertically stacked top semiconductor nanosheets 106NS. The semiconductor structure illustrated in FIGS. 4A-4D also includes like elements as shown in FIGS. 3A-3D; these like elements are labeled with the same reference numerals, In the embodiments illustrated in FIGS. 4A-4D, a bottom gate structure (116/117) wraps around the plurality of bottom semiconductor nanosheets 102NS, and the a top gate structure (116/118) wraps around the plurality of top semiconductor nanosheets 106NS. It is noted that the nanosheet embodiment shown in FIGS. 4A-4D is the same as the fin embodiment shown in FIGS. 3A-3D except for the geometry change.

The bottom semiconductor nanosheets 102NS and top semiconductor nanosheets 106NS including one of the semiconductor materials mentioned above in describing the semiconductor channel material structures. The semiconductor material that provides the bottom semiconductor nanosheets 102NS can be compositionally the same as, or compositionally different from, the semiconductor material that provides the top semiconductor nanosheets 106NS. The bottom dielectric isolation layer 150 and the inner spacers 151 are composed of well known dielectric materials.

The semiconductor structure shown in FIGS. 4A-4D can be fabricated utilizing any stacked FET processing flow in which semiconductor nanosheets are used in both device levels. Such stacked FET processing includes various deposition steps, various patterning steps, various material removal steps and various planarization steps. So as not to obscure the semiconductor structure of the present application, these various processing steps are not further elaborated herein.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a bottom device level including a first bottom field effect transistor (FET) of a first conductivity type, a second bottom FET of the first conductivity type, a third bottom FET of the first conductivity type, and a fourth bottom FET of the first conductivity type, wherein the first bottom FET is electrically connected to the second bottom FET and the third bottom FET is electrically connected to the fourth bottom FET, and the first bottom FET is located diagonally to the fourth bottom FET and the second bottom FET is located diagonally to the third bottom FET, and the first bottom FET and the fourth bottom FET are pass gates; and a top device level stacked above the bottom device level and including a first top FET of a second conductivity type different from the first conductivity type located directly above the first bottom FET, a second top FET of the second conductivity type located directly above the second bottom FET, a third top FET of the second conductivity type located directly above the third bottom FET, and a fourth top FET of the second conductivity type located directly above the fourth bottom FET, wherein the first top FET is electrically connected to the second top FET and the third top FET is electrically connected to the fourth top FET, and the first top FET is a first dummy transistor which is wired to cross-couple with the third top FET and the fourth top FET is a second dummy transistor which is wired to cross-couple with the second top FET, and the second bottom FET and the second top FET are wired to provide a first inverter and the third bottom FET and the third top FET are wired to provide a second inverter.

2. The semiconductor structure of claim 1, wherein the first top FET comprises a gate electrode that forms an extension of an input of the first inverter, and the fourth top FET comprises another gate electrode that forms an extension of an input of the second inverter.

3. The semiconductor structure of claim 1, wherein the first bottom FET comprises a gate electrode that is isolated from a gate electrode of the first top FET and the fourth bottom FET comprises a gate electrode that is isolated from a gate electrode of the fourth top FET.

4. The semiconductor structure of claim 1, wherein the first conductivity type is n-type and the second conductivity type is p-type.

5. The semiconductor structure of claim 1, wherein the first conductivity type is p-type and the second conductivity type is n-type.

6. The semiconductor structure of claim 1, wherein the first top FET has a source/drain region located on one side that is shared with the second top FET, the third top FET has a source/drain region located on one side that is shared with the fourth top FET, the first bottom FET has a source/drain region located on one side that is shared with the second bottom FET, the third bottom FET has a source/drain region located on one side that is shared with the fourth bottom FET.

7. The semiconductor structure of claim 6, wherein the shared source/drain region of the first top FET and the second top FET is electrically connected to the shared source/drain region of the first bottom FET and the second bottom FET, and the shared source/drain region of the third top FET and the fourth top FET is electrically connected to the shared source/drain region of the third bottom FET and the fourth bottom FET.

8. The semiconductor structure of claim 1, further comprising a word line electrically connected to a gate electrode of both the first bottom FET and the fourth bottom FET.

9. The semiconductor structure of claim 8, further comprising a bit line electrically connected to a source/drain region of both the first bottom FET and the fourth bottom FET.

10. The semiconductor structure of claim 1, wherein the first bottom FET includes a gate electrode that spaced apart from a gate electrode of the second bottom FET by a dielectric structure, and the third bottom FET includes a gate electrode that spaced apart from a gate electrode of the fourth bottom FET by another dielectric structure.

11. The semiconductor structure of claim 1, wherein the first top FET and the second top FET comprise a shared gate electrode, and the third top FET and fourth top FET comprise another shared gate electrode.

12. The semiconductor structure of claim 1, wherein the second top FET and the third top FET are both wired to a power source, and the second bottom FET and the third bottom FET are both grounded.

13. The semiconductor structure of claim 1, wherein each of the first bottom FET, the second bottom FET, the third bottom FET, the fourth bottom FET, the first top FET, the second top FET, the third top FET and the fourth top FET are located on a semiconductor channel material structure.

14. The semiconductor structure of claim 13, wherein the semiconductor channel material structure is a semiconductor fin.

15. The semiconductor structure of claim 13, wherein the semiconductor channel material structure is a semiconductor nanowire.

16. The semiconductor structure of claim 1, wherein the cross-couple of the first dummy transistor with the third top FET comprises a first contact metal that contacts both a gate electrode and a source/drain region a first dummy gate region, and the cross-couple of the second dummy transistor with the second top FET comprises a second contact metal that contacts both a gate electrode and a source/drain region of a second dummy gate region.

17. The semiconductor structure of claim 16, wherein both the first dummy gate region and the second dummy gate region are non-functional gate structure with a removed or partially removed source/drain region.

18. The semiconductor structure of claim 1, wherein the first top FET, the third top FET and the third bottom FET electrically share a common gate electrode, and the fourth top FET, the second top FET and the second bottom FET electrically share a common gate electrode.

* * * * *